United States Patent
Schelmbauer et al.

(10) Patent No.: US 7,831,234 B2
(45) Date of Patent: Nov. 9, 2010

(54) MIXER ARRANGEMENT, USE OF THE MIXER ARRANGEMENT AND METHOD FOR FREQUENCY CONVERSION

(75) Inventors: Werner Schelmbauer, Linz (AT); Josef Zipper, Linz (AT)

(73) Assignee: Infineon Technologies AG, Munich (DE)

( * ) Notice: Subject to any disclaimer, the term of this patent is extended or adjusted under 35 U.S.C. 154(b) by 1173 days.

(21) Appl. No.: 11/472,632

(22) Filed: Jun. 21, 2006

(65) Prior Publication Data
US 2007/0010228 A1    Jan. 11, 2007

(30) Foreign Application Priority Data
Jun. 21, 2005    (DE)    ........................ 10 2005 028 747

(51) Int. Cl.
*H04B 1/26*    (2006.01)
(52) U.S. Cl. .................... 455/323; 455/341; 455/234.1; 330/258
(58) Field of Classification Search .................. 455/341, 455/323, 118, 326, 313, 293, 324, 234.1, 455/318; 330/258
See application file for complete search history.

(56) References Cited

U.S. PATENT DOCUMENTS

| | | | |
|---|---|---|---|
| 6,850,753 B2 * | 2/2005 | Zhang et al. ................. | 455/341 |
| 6,865,382 B2 * | 3/2005 | Behzad ........................ | 455/323 |
| 6,889,037 B2 | 5/2005 | Darabl | |
| 7,027,783 B2 * | 4/2006 | Vilhonen et al. ............. | 455/118 |
| 7,088,169 B2 * | 8/2006 | Erba et al. ................... | 327/359 |
| 7,138,857 B2 * | 11/2006 | Schelmbauer ............... | 329/323 |
| 7,259,569 B2 * | 8/2007 | Kim ............................ | 324/601 |
| 2004/0247036 A1 * | 12/2004 | Hedberg et al. ............. | 375/257 |
| 2007/0142018 A1 * | 6/2007 | Lin et al. ..................... | 455/326 |
| 2008/0139159 A1 * | 6/2008 | Ojo et al. .................... | 455/313 |
| 2008/0268805 A1 * | 10/2008 | Hsieh et al. ................. | 455/293 |
| 2009/0029668 A1 * | 1/2009 | Hsieh et al. ................. | 455/324 |

FOREIGN PATENT DOCUMENTS

DE    103 44 876 B3    5/2005

(Continued)

OTHER PUBLICATIONS

*Analysis and Design of Analog Integrated Circuits*, Chapter 10 "Nonlinear Analog Circuits", P. Gray et al., 4th Edition, John Wiley & Sons, 2004, 8 pgs.

*Primary Examiner*—Edward Urban
*Assistant Examiner*—Christian A Hannon
(74) *Attorney, Agent, or Firm*—Eschweiler & Associates, LLC

(57) ABSTRACT

A mixer arrangement includes a mixer cell coupled by a signal input to a mixer input, and is embodied for frequency conversion of a signal present on the input side to an intermediate frequency. A first current source is coupled to the signal input of the mixer cell, and a second current source is coupled to a signal output of the mixer cell. The mixer arrangement furthermore includes a sensor circuit embodied for detection and for outputting of a value which is derived from a current of one of the current sources. A desired value regulating circuit is coupled by a feedback input to the sensor circuit and is designed for outputting a regulating signal to the one current source derived from a comparison of a signal present at a feedback input with a desired value.

14 Claims, 8 Drawing Sheets

FOREIGN PATENT DOCUMENTS

| | | |
|---|---|---|
| EP | 0951138 A1 | 10/1999 |
| JP | 8046434 A | 2/1996 |
| JP | 09-242894 | 9/1997 |
| JP | 09-284160 A | 10/1997 |
| JP | 10-303649 | 11/1998 |
| JP | 2003-234619 A | 8/2003 |
| JP | 2004-356763 | 12/2004 |
| JP | 2005-102141 A | 4/2005 |
| WO | WO 2005/011103 A1 | 2/2005 |

* cited by examiner

MIXER ARRANGEMENT, USE OF THE MIXER ARRANGEMENT AND METHOD FOR FREQUENCY CONVERSION

REFERENCE TO RELATED APPLICATIONS

This application claims the benefit of the priority date of German application DE 10 2005 028 747.6, filed on Jun. 21, 2005, the contents of which are herein incorporated by reference in their entirety.

FIELD OF THE INVENTION

The invention relates to a mixer arrangement and a use of the mixer arrangement. The invention furthermore relates to a method for frequency conversion.

BACKGROUND OF THE INVENTION

Frequency mixers, generally also called frequency converters, form important components in a multiplicity of different applications pertaining to radiofrequency technology. They generally serve to convert a signal having a first center frequency to an output signal having a second frequency with the aid of a local oscillator signal. In this case a distinction is made between mixers in which the frequency of the output signal is greater than the frequency of the input signal and mixers in which the frequency of the output signal is less than the input signal frequency. The former are also referred to as up-converters, and the latter as down-converters.

In the case of down-converters, a distinction is additionally made between frequency converters which convert the input signal to a low intermediate frequency or to an intermediate frequency of 0 HZ. Conversion to an intermediate frequency of 0 HZ additionally has the advantage that the converted signal can be subjected to further processing directly after suitable filtering. Modern telecommunications frequency converters which effect conversion to an intermediate frequency of 0 HZ are best suited to realizing customers' requirements for low current consumption, small chip area and hence low price. In the meantime, frequency converters of this type are being implemented as integrated circuits in semiconductor bodies using purely CMOS technology (complementary MOS technology). The requirements made of the transfer response, the signal/noise ratio and the current consumption of the frequency converters of this type are rising at the same time.

A significant aspect in the use of mixers with conversion to the intermediate frequency 0 HZ using CMOS technology is so-called flicker noise, which is brought about by the defects in the gate material of the MOS transistors within the mixer and leads to a reduction of the signal/noise ratio. Flicker noise usually constitutes a dominant noise source in mixers having primarily a small signal bandwidth which are formed using field-effect transistors. Further flicker noise sources situated upstream of the actual mixer cell within the mixer are converted to higher frequencies and mainly do not cause any impairment of the signal/noise ratio.

Flicker noise is proportional to the current flowing through the transistor and proportional to the frequency of the local oscillator signal. A reduction of the flicker noise of the frequency converter on the output side can be achieved for example by increasing channel length of the field-effect transistors used. However, this leads to an increased loading on the driver circuits for providing the local oscillator signal and thus to a reduction of the changeover speed. Since flicker noise principally becomes apparent at the changeover instant at the output of the frequency converter, the overall performance may be impaired as a result.

FIG. 7 shows a known down-converter realized as a slightly modified Gilbert mixer. The heart of the frequency converter is a mixer cell 1, which comprises four field-effect transistors T5 to T8 as illustrated here. The radiofrequency signal RF+, RF− to be converted, which is present as a differential-mode signal in the present case is converted into a current signal by means of transistors T1 to T2 operating as a voltage-current converter and is fed to the actual mixer cell 1. On the output side, the mixer cell is connected to the output taps via two field-effect transistors T13 and T14 acting as a cascade. The frequency-converted current signal is converted into a voltage signal again by means of the resistors R1 and R2.

In order to reduce the flicker noise in the mixer cells, in this known present case, part of the DC current is extracted via the additional current sources I1, I2. This decreases the direct current through the mixer cell 1 and thus the flicker noise as well. A reduction of the DC current through the current sources I1 to I4 is effected only as long as the linearity requirement of the mixer cell 1 can be complied with.

According to the Inventor's knowledge, a further possibility for reducing flicker noise comprises implanting fluorine ions into the field-effect transistors of the mixer cell 1. This technology option relates primarily to production, where it causes additional process steps and hence an increase in the production costs.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a mixer arrangement in which flicker noise is reduced. Likewise, the intention is to specify a use of this mixer arrangement. The invention is also directed to a method for frequency conversion in which the flicker noise is reduced by comparison with previous methods.

The present invention includes a mixer arrangement which makes it possible to reduce the common-mode current through the actual mixer cell as far as a completely currentless switching of the mixer cell. The further reduction of the current leads to a reduction of flicker noise whilst at the same time maintaining the linearity performance. In addition, it is also possible in this way to dispense with a complicated fluorine implantation of the transistors.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in detail with explanation of various embodiments and examples with reference to the drawings, in which.

DETAILED DESCRIPTION OF THE INVENTION

Figure 1:
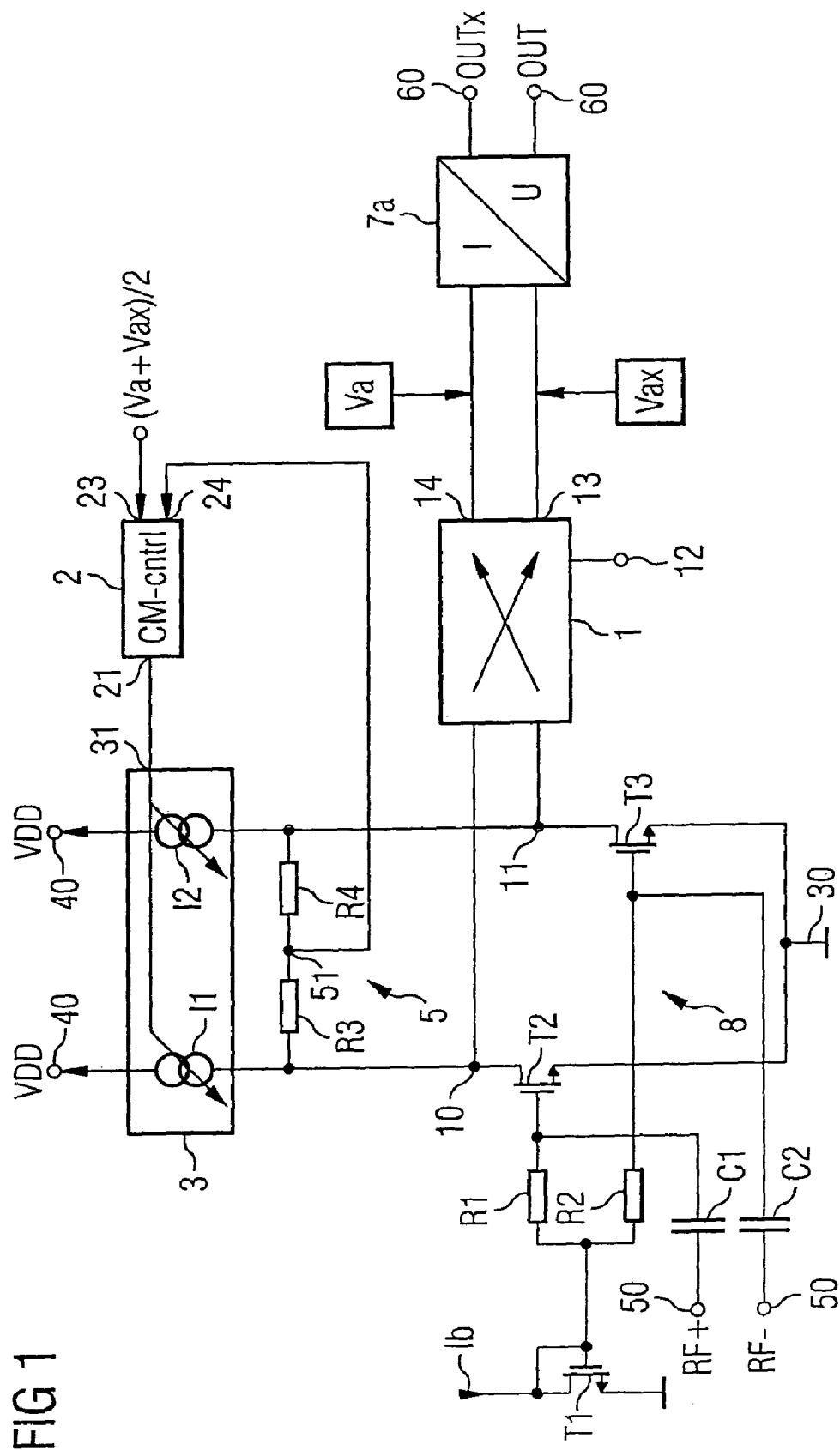
FIG. 1 is a combined schematic/block diagram illustrating a mixer according to one embodiment of the invention.

The embodiments illustrated below are in no way restrictive. They can be combined or modified as desired without contravening the essence of the invention. The configurations set forth thus form possible and in no way finally enumerated embodiments of the invention.

In one possible embodiment, a mixer arrangement in accordance with the principle proposed may comprise, for example, a mixer input for feeding in a radiofrequency signal. A mixer cell is coupled by a signal input to the mixer input. The mixer cell has a local oscillator input and a signal output. The mixer cells converts a signal on the input side to an intermediate frequency with the aid of a signal at the local oscillator input. A first current source is coupled to the signal input of the mixer cell. A second current source is likewise connected to the signal output of the mixer cell. At least one of the first and of the second current source comprises a regulatable current source having a control input. Furthermore, the mixer arrangement contains a sensor circuit, configured to detect and output a value derived from a current level of the at least one current source. A desired value regulating circuit is coupled by a feedback input to the sensor circuit. The desired value regulating circuit has a regulating output connected to the control input of the regulatable current source. The desired value circuit is configured to output a regulating signal to the regulating output, derived from a comparison of a signal present at the feedback input with a desired value.

The regulation of the current source output current by the desired value regulating circuit makes it possible to adapt a common-mode level at the input or at the output of the mixer cell to the respective other common-mode level at the input or at the output of the mixer cell. This is done, in one example, by virtue of the common-mode level of the current source output current being set by the desired value regulating circuit in such a way that the common-mode levels at the signal input and at the signal output of the mixer cell are substantially identical in magnitude. As a result, only a very small DC current flows through the mixer cell, or no DC current at all flows any longer through the mixer cell, and the flicker noise is greatly reduced.

In one embodiment of the invention, the sensor circuit is configured to detect a common-mode level of the at least one current source. In a further embodiment of the invention, the regulatable current source is connected to the input of the mixer cell. As a result, the common-mode level at the input of the mixer cell is regulated with the aid of the desired value circuit. As an alternative, in a further embodiment, the regulatable current source is coupled to the output of the mixer cell. The common-mode level at the output of the mixer cell is then regulated correspondingly by the desired value regulating circuit.

In another embodiment of the invention, a circuit is provided that is configured to provide the desired value and is connected to a reference input of the desired value regulating circuit. The circuit detects a value derived from a current level of the respective other current source of the first and the second current source. As a result, the values which are derived from the current level of the regulatable current source and the current level of the other current source are fed to the desired value regulating circuit. In this embodiment, the common-mode level at the signal input and at the signal output of the mixer can be determined directly and the output current of at least one current source can be set with the aid of the desired value regulating circuit and the common-mode levels at the signal input and signal output are thus matched to one another.

In a further embodiment of the invention, the circuit comprises a first resistor and a second resistor connected in series. Between the two resistors a tap is coupled to the reference input of the desired value regulating circuit. The respective other terminals of the first resistor and of the second resistor connected in series are connected to the signal output of the mixer cell. As a result, it is possible to derive a value depending on a current level or a common-load level at the output of the mixer cell and feed it to the reference input of the desired value regulating circuit.

In another embodiment of the invention, the circuit comprises a first transistor and a second transistor connected in series. The transistors are connected between a supply potential terminal and a ground potential terminal. Between the transistors a tap is coupled to the reference input of the desired value regulating circuit.

In a further embodiment of the invention, the at least one current source, configured as a regulatable current source, has a transistor, the first terminal of which is coupled to a supply potential terminal. The second terminal of the transistor forms an output of the at least one current source. A control terminal of the transistor is coupled to the control input of the at least one current source. In an alternative embodiment, the at least one current source, configured as a regulatable current source, contains a current mirror. The output of one of the current mirror transistors forms the output of the current source and the other of the current mirror transistors is connected to the control input of the at least one current source. The current mirror transistors are embodied with field-effect transistors.

In a further embodiment of the invention, a current-voltage converter for converting a frequency-converted current signal output by the mixer cell into a voltage signal is connected downstream of the signal output of the mixer cell. In this embodiment, the mixer cell is configured to process and frequency convert current signals. In one example, a voltage signal fed to the mixer input of the mixer arrangement is likewise converted into a current signal by means of a voltage-current converter and is subsequently fed as input signal to the mixer cell. For this purpose, a corresponding voltage-current converter is connected upstream of the signal input of the mixer cell.

In a further embodiment of the invention, an operational amplifier is connected downstream of the output of the mixer cell. In one example, an output of the operational amplifier is coupled to an input of the operational amplifier via a capacitive element and a resistive load arranged in parallel therewith. This configuration achieves a low input impedance and also an amplitude response dependent on the frequency response.

The operational amplifier configuration additionally has the advantage that when the mixer arrangement is embodied within a Gilbert mixer, it is possible to realize a complex pole point in the form of a polyphase filter in a simple manner. As a result, it is possible to realize a Gilbert mixer and an I/Q mixer which is configured to convert and decompose a radiofrequency signal into a real component and a quadrature component in each case at an intermediate frequency. In one embodiment, the intermediate frequency is 0 HZ and the Gilbert mixer forms a so-called 0 HZ frequency converter.

With regard to the method, in on embodiment a radiofrequency signal is provided and converted to an intermediate frequency with the aid of a mixer cell. In order to improve the flicker noise during conversion, provision is made for detecting a first signal derived from a first common-mode level at the signal input of the mixer cell. A second signal derived from a second common-mode level at the signal output of the mixer cell is likewise detected. At least one common-mode level of the first or second common-mode level is then altered in such a way that the first and the second common-mode levels substantially match in terms of their values. Consequently, in terms of value the same common-mode level is present both at the signal output and at the signal input of a mixer cell, as a result of which the flicker noise is quickly reduced on account of the very small or even absent common-mode current flowing via the mixer cell.

In another embodiment of the method, the common-mode level at the signal input of the mixer cell is changed by reducing or increasing the supply current of a current source coupled to the signal input of the mixer cell. As an alternative embodiment of the method according to the invention, the common-mode level at the signal output of the mixer cell can be correspondingly set by changing a supply current of a current source coupled to the signal output of the mixer.

In a further embodiment of the invention, the radiofrequency signal is converted into a current signal with a differential-mode component. This signal, together with a supply signal having a common-mode level, is converted to an intermediate frequency signal with the aid of a local oscillator signal. Afterward, the converted current signal is converted back into a voltage signal. What is achieved by means of corresponding regulation of the common-mode level at the signal input and at the signal output of the mixer cell is that no additional common-mode current flows via the latter and thus impairs the flicker noise.

The method according to the invention can be used for any mixer cell which is operated as an active mixer cell, that is to say with a current lead.

FIG. 1 now shows a block diagram for illustrating one embodiment and the new topology which makes it possible to reduce the current through the mixer cell as far as so-called currentless switching of the mixer cell. The entire mixer arrangement including the mixer cell 1 is embodied as a so-called push-pull mixer. The mixer cell 1 comprises a first input terminal 10 and a second input terminal 11 for feeding in a differential-mode signal. The mixer cell 1 furthermore comprises a first output tap 13 and also a second output tap 14 and a local oscillator input 12 for feeding in a local oscillator signal. In the present example, the mixer cell 1 comprises field-effect transistors using CMOS technology. The transistors can be embodied in a particularly simple and space-saving manner as integrated circuits in a semiconductor body. It is likewise conceivable for bipolar transistors additionally to be provided in the mixer cell.

The input terminals 10 and 11 of the mixer cell 1 are connected to a voltage-current converter 8. The latter comprises two field-effect transistors T2 and T3, the respective source terminals of which are connected to a ground potential terminal 30. Each of the two field-effect transistors in each case forms a current mirror together with the transistor T1. For this purpose, the control terminals of the two transistors T2, T3 of the voltage-current converter 8 are coupled to the control terminal of the transistor T1 via the resistors R1 and R2. A bias current Ib is fed to the transistor T0 at a first terminal, and sets an operating point of the two transistors T2, T3 via the current mirror and the resistors R1, R2.

The control terminal of the transistor T2 of the voltage-current converter 8 is coupled via a capacitor C1 to a first mixer terminal 50 for feeding in a radiofrequency signal RF. The control terminal of the transistor T3 is likewise also connected via a corresponding capacitor C2 to the mixer terminal 50. A radiofrequency signal in the form of a differential-mode signal is fed to the two control terminals of the voltage-current converter 8 via the mixer input 50. The two transistors T2 and T3 convert the input voltage signal into a current signal. A regulatable current source 3 is additionally connected to the input terminals 10 and 11 of the mixer cell 1. The regulatable current source comprises two individual regulatable current sources I1 and I2, the control terminals of which are connected to a regulating input 31 of the regulatable current source 3. In detail, the current source I1 is connected between a supply potential terminal 40 for feeding in a supply potential VDD and the input terminal 10. The current source I2 is correspondingly arranged between the supply potential terminal 40 and the input terminal 11. The two current sources I1 and I2 are at high impedance for the signal current of the radiofrequency signal converted by the voltage-current converter 8. In contrast to this, the mixer cell 1 is at low impedance for the signal current provided that the output is terminated at low impedance, as is the case here. The signal current fed in on the input side is converted to an intermediate frequency in the mixer cell 1 and output at the outputs 13 and 14 of the mixer cell.

A current-voltage converter 7a is connected to the outputs 13 and 14 and converts the converted signal current into a voltage signal again and outputs it at its output 60. Within the current-voltage converter 7a care must be taken to ensure that the current corresponding to the linearity requirements of the mixer cell can flow.

A desired value regulating circuit 2 is furthermore provided for regulating purposes, the regulating output 21 of the desired value regulating circuit being connected to the regulating input 31 of the regulatable current source 3. Furthermore, the desired value regulating circuit 2 has a reference input 23 and also a feedback input 24. The feedback input 24 is connected to a sensor circuit 5. In detail, the sensor circuit 5 comprises two resistors R3 and R4 connected in series, which are connected by their respective other terminals to the signal terminals 10 and 11, respectively. The tap 51 between the two resistors is coupled to the feedback input 24 of the desired value regulating circuit 2.

By means of this arrangement of the sensor circuit 5, a common-mode level of the signal fed to the input of the mixer cell 1 is determined at the tap 51. The common-mode level is dependent on the current output by the regulatable current source 3. The desired value regulating circuit 2 then compares the common-mode level with a reference signal and generates from this a corresponding control signal for the regulatable current source 3. A desired value fed to the desired value regulating circuit 2 at its reference input 23 is used as reference level for this purpose.

The desired value or reference level, in one example, results from a common-mode level at the output of the mixer cell 1, in the present example from half of the sum of the two common-mode potentials, Va and Vax. The desired value regulating circuit 2 compares the desired value with the common-mode level at the input of the mixer cell 1 and subsequently controls the regulatable current source 3 such that the two common-mode levels at the signal inputs and the signal outputs of the mixer cell 1 are substantially identical in this example. On account of the regulation, a common-mode potential difference between the signal input and the signal output is approximately 0 V, so that no common-mode current flows via the mixer cell 1. This reduction of the common-mode current leads to an extraordinary reduction of flicker noise whilst at the same time maintaining the linearity performance. The signal/noise ratio in the frequency-converted signal is considerably improved as a result.

Alternatively, the present invention contemplates an option not to adapt the common-mode level at the signal input to the common-mode level at the signal output, but rather to alter the common-mode level at the signal output of the mixer cell by means of a regulatable current source. In such a case, the signal output of the mixer cell is coupled to a regulatable current source, the regulating input of which is connected to the desired value regulating circuit. The sensor circuit 5 is correspondingly also then arranged at the output of the mixer cell 1.

Figure 2:
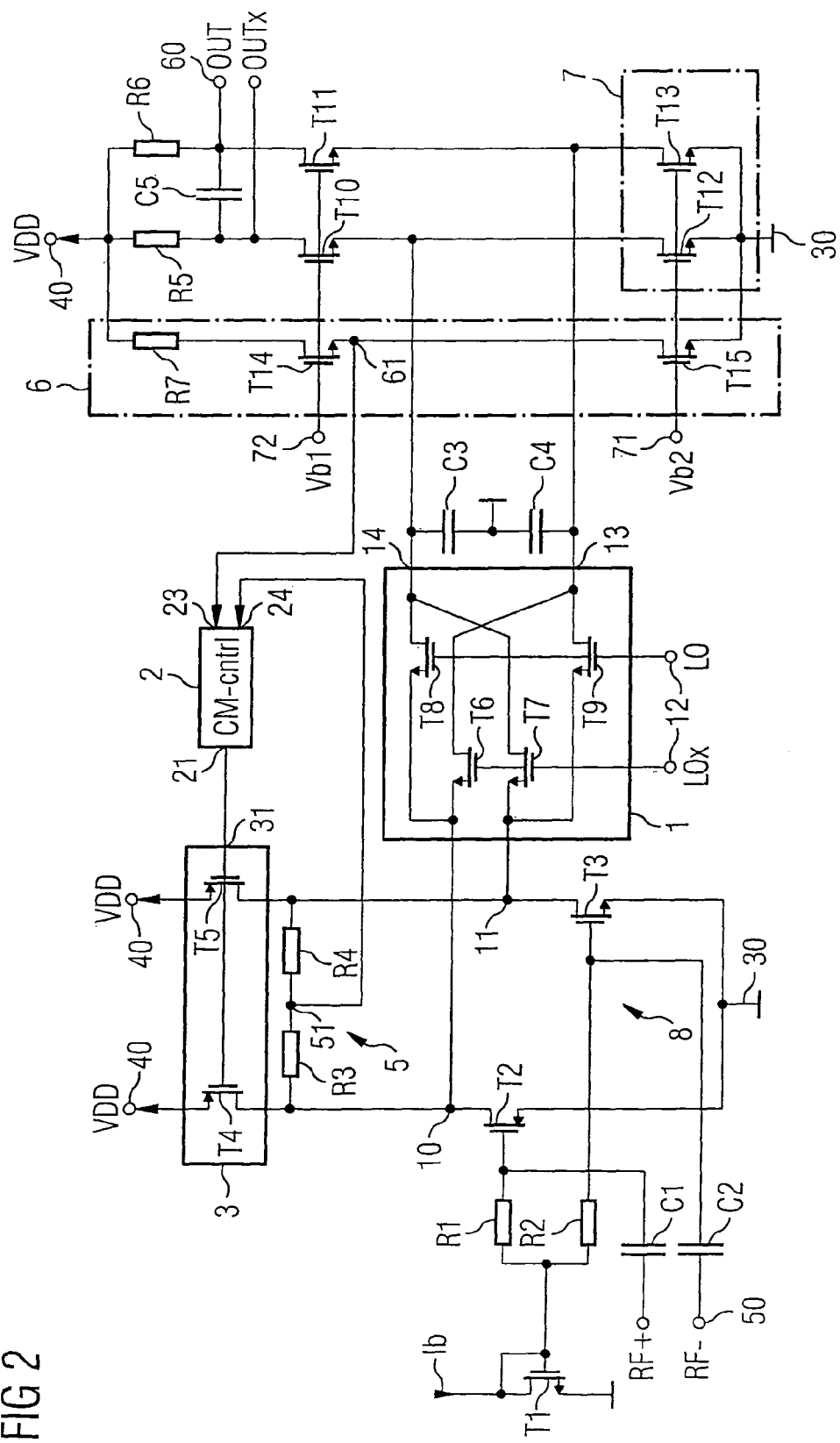
FIG. 2 is a schematic diagram illustrating another embodiment of the invention.

One exemplary embodiment of a mixer arrangement with an embodiment of a current-voltage converter 7a is shown in FIG. 2. Functionally and operatively identical components bear the same reference symbols.

In this exemplary embodiment, the local oscillator signal is present as a differential-mode signal at the local oscillator input 12. In accordance with FIG. 2, the mixer cell 1 comprises four field-effect transistors T6 to T9, of which the field-effect transistors T6, T8 and T7, T9 are respectively connected by their source terminals to the input terminals 10 and 11, respectively. The local oscillator signal LO is fed in at the control terminals of the field-effect transistors T8 and T9 and the corresponding differential-mode signal LOx is fed in at the control terminals of the field-effect transistors T6 and T7. The drain terminal of the transistor T7 is connected to the drain terminal of the field-effect transistor T8 and the drain terminal of the field-effect transistor T6 is connected to the field-effect transistor T9. As a result, the mixer cell shown is embodied as a so-called push-pull mixer.

The two series-connected capacitors C3 and C4 are arranged between the outputs 13 and 14 of the mixer cell 1. Between the two capacitors a tap is connected to the ground potential. The capacitances of the two capacitors C3 and C4 are chosen such that they serve for suppressing converted frequency components at the output of the mixer cell and in particular for suppressing the upper sideband which is generated during the frequency conversion.

Furthermore, the two output taps 13 and 14 are connected to a current source 7. The latter contains two transistors T12 and T13 arranged in parallel, which are connected jointly by one terminal to the ground potential terminal 30. The control terminal is connected to a regulating input 71 for feeding in a bias potential Vb2. During operation of the mixer arrangement, the two transistors T12 and T13 operate as DC current sources and generate a corresponding common-mode level at the output of the mixer cell.

In addition, the output of the mixer cell is coupled to a supply potential terminal 40 via two transistors T10, T11 acting as a cascode and two resistors R5, R6. The two resistors R5 and R6 convert the frequency-converted current signal output by the mixer cell 1 into a voltage signal and output it as converted differential-mode output signal OUT, OUTx via the output taps 60. The voltage drop at the output taps 60 is set by way of the value of the two resistors R5, R6. The capacitor C5 arranged between the two resistors forms together with the latter a passive pole for suppressing blocking signals and adjacent channels.

In the embodiment of FIG. 2, the desired value for the desired value circuit 2 is obtained from a reference structure 6. In one example, the reference structure 6 contains two series-connected field-effect transistors T14, T15 of the n-channel type. One terminal of the field-effect transistor T14 is connected to the supply potential terminal 40 via a resistor R7. The field-effect transistor T15 is connected, for its part, to the ground potential terminal 30. The field-effect transistor T15 acts as a current source and is driven by means of the bias potential Vb2. The field-effect transistor T14 operates as a cascode transistor and is driven with the potential Vb1, which is also present at the control terminals of the cascode transistors T10 and T11 of the current-voltage converter. A tap 61 is furthermore provided between the two transistors T15 and T14, said tap being connected to the reference input 23 of the desired value regulating circuit 2.

If the transistors T14, T15 are chosen suitably, a DC current whose level substantially corresponds to the common-mode level at the output of the mixer cell 1 flows via the reference structure. By way of example, the transistors correspond in terms of their size and geometrical dimensioning and also their construction to the transistors of the current source 7 and the cascode transistors T10, T11. The desired value at the node 61 thus permits the desired value regulating circuit to regulate the common-mode level of the current output by the current source 3, so that the two common-mode levels at the signal outputs and the signal inputs of the mixer cell 1 are substantially identical.

In the embodiment illustrated here, the transistors T4, T5 of the regulatable voltage source 3 are embodied as p-channel field-effect transistors. N-channel field-effect transistors can also be connected in the same way. It is likewise also possible here to use bipolar transistors or to provide a regulation of the current of the current source 3 by means of impressing with the aid of current mirrors.

The voltage-current conversion circuit 8 comprising the two transistors T2 and T3 likewise uses field-effect transistors of the n-channel type in this example. These transistors permit a higher transconductance and thus higher switching speeds than in the case of comparable field-effect transistors of the p-channel type. The current-voltage conversion circuit at the outputs 13 and 14 of the mixer cell 1 is embodied at low impedance with regard to the signal current of the converted signal.

Figure 3A:
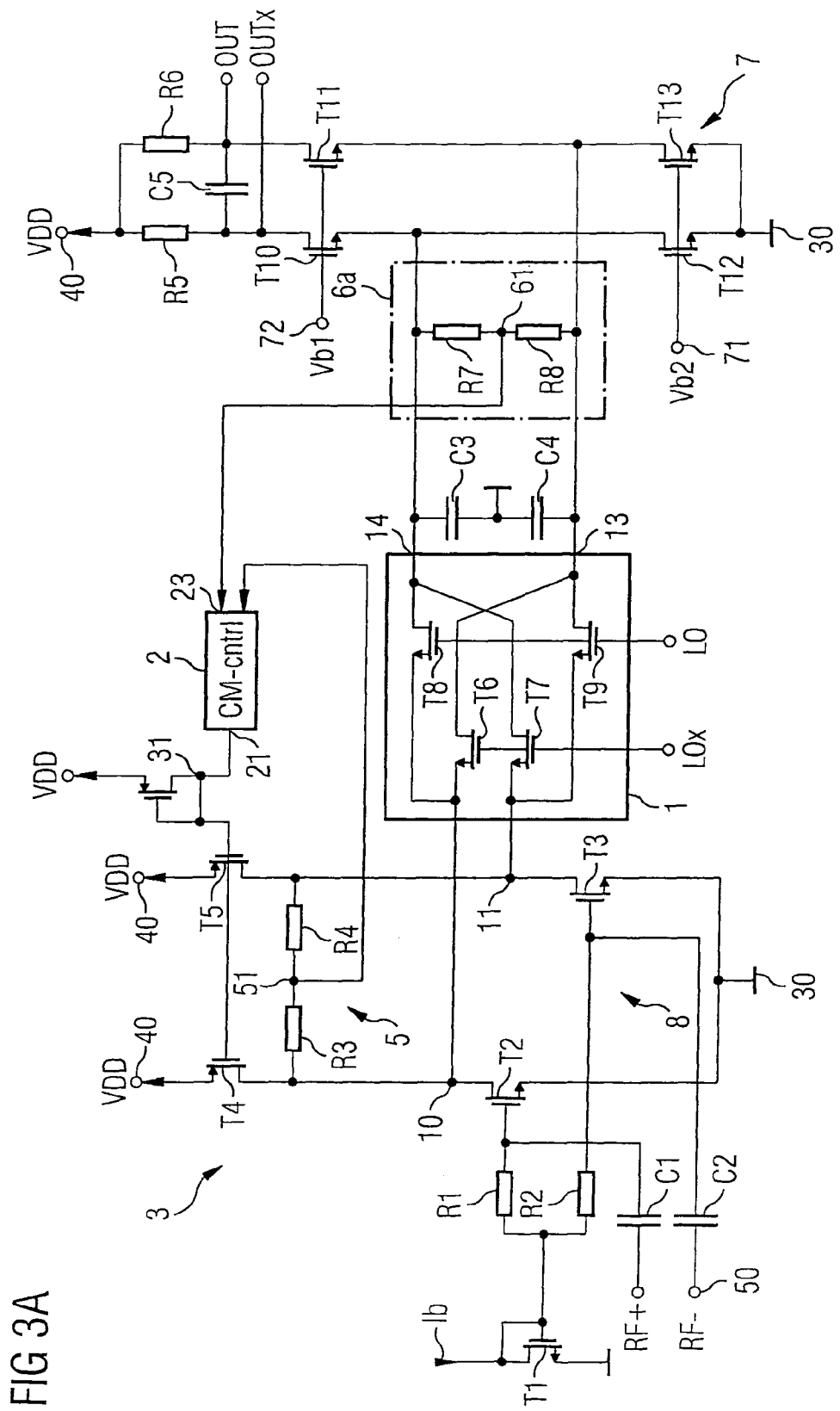
FIG. 3A is a schematic diagram illustrating another embodiment of the invention.

In a departure from the embodiment shown in FIG. 2, the desired value can also be detected directly at the output of the mixer cell by means of a measurement of a common-mode level at the signal output of the mixer cell. Such an embodiment is shown in FIG. 3a. Operatively and functionally identical components bear the same reference symbols here as well.

This embodiment is provided with an additional sensor circuit 6a. The latter comprises two resistors R7 and R8 connected in series. A tap 61 is provided between the two resistors, said tap being coupled to the reference input 23 of the desired value regulating circuit 2. The respective other terminals of the two resistors R7, R8 are connected to the output 14 and 13, respectively, of the mixer cell.

Moreover, in this embodiment, the current source 3 regulated by the control circuit 2 is configured as a current mirror. For this purpose an n-channel field-effect transistor is provided as a current mirror transistor, which is connected by a first terminal to the supply potential VDD. A second terminal of the current mirror transistor is connected to a control terminal on the one hand, and to the control terminals of the transistors T4, T5 on the other hand. The second terminal of the current mirror transistor also forms the regulating input 31 and is connected to the regulating output 21 of the desired value regulating circuit 2.

During operation of this circuit, a radiofrequency signal RF at the mixer input 50 is converted into a differential-mode current signal with the aid of the voltage-current converter by means of the two field-effect transistors T2 and T3. This differential-mode signal is fed to the inputs 10 and 11 of the mixer cell 1 and is converted to an intermediate frequency with the aid of the local oscillator signal LOx, LO in the mixer cell 1 and is output at the outputs 13 and 14. The upper frequency band produced during the frequency conversion is suppressed by the two capacitors C3 and C4, which act as a low-pass filter.

At the same time, DC currents having a common-mode level are output by the current sources 3 and 7. Accordingly, besides the actual radiofrequency signal component, a common-mode level is also present at the signal inputs 10 and 11. A common-mode level is correspondingly present at the outputs 13 and 14, this common-mode level being derived inter alia, from the current of the current source 7 and from the bias potential Vb1. In this embodiment, the bias potential Vb1 for setting the operating point of the current-voltage converter comprising the resistors R5, R6 and the transistors T10, T11 is set in a fixed manner.

The common-mode potential between the output 13 and 14 of the mixer cell 1 is then determined by means of the sensor circuit 6a and fed as a desired value to the desired value regulating circuit 2. The latter compares the desired value with the common-mode potential at the inputs 10 and 11, which in turn depends on the current of the regulatable current source 3. Depending on the comparison, the current of the regulatable current source 3 is increased or decreased until the common-mode levels at the signal input of the mixer cell and at the signal output of the mixer cell substantially match. In such a case, no DC voltage is dropped across the mixer cell 1. Therefore, this is also referred to as currentless switching, since the mixing operation is then effected solely by means of the differential-mode signal component of the radiofrequency signal RF converted into the current signal.

Figure 3B:
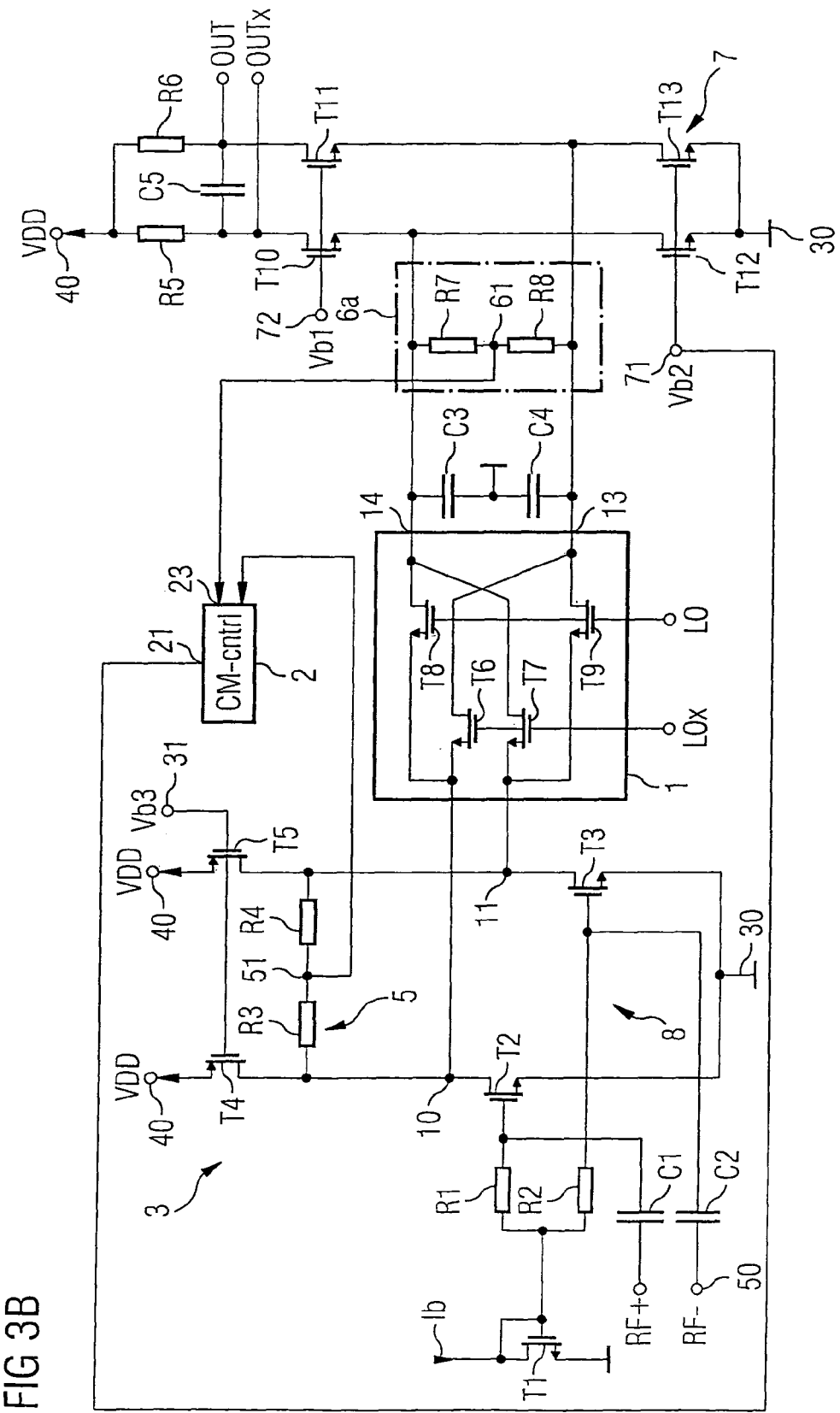
FIG. 3B is a schematic diagram illustrating a modification of the embodiment of FIG. 3A.

FIG. 3B shows a modification in this regard. In this case, regulation for setting the common-mode level is effected by means of control of the current source 7 rather than of the current source 3. For this purpose, the terminal 71 is coupled to the output 21 of the control circuit 2. The potential Vb2 is fed to the current source 7 at the control input. In this configuration, too, the sensors 5 and 6a determine the common-mode potentials at the input and at the output of the mixer cell 1. The common-mode level at the output of the mixer cell is altered and adapted to the level at the input of the mixer cell. As an alternative, it is possible to carry out an adaptation of the common-mode levels by means of regulating the potential Vb1 at the input 71 rather than by means of regulating the bias potential Vb2 at the input 71 of the current source 7.

Figure 6:
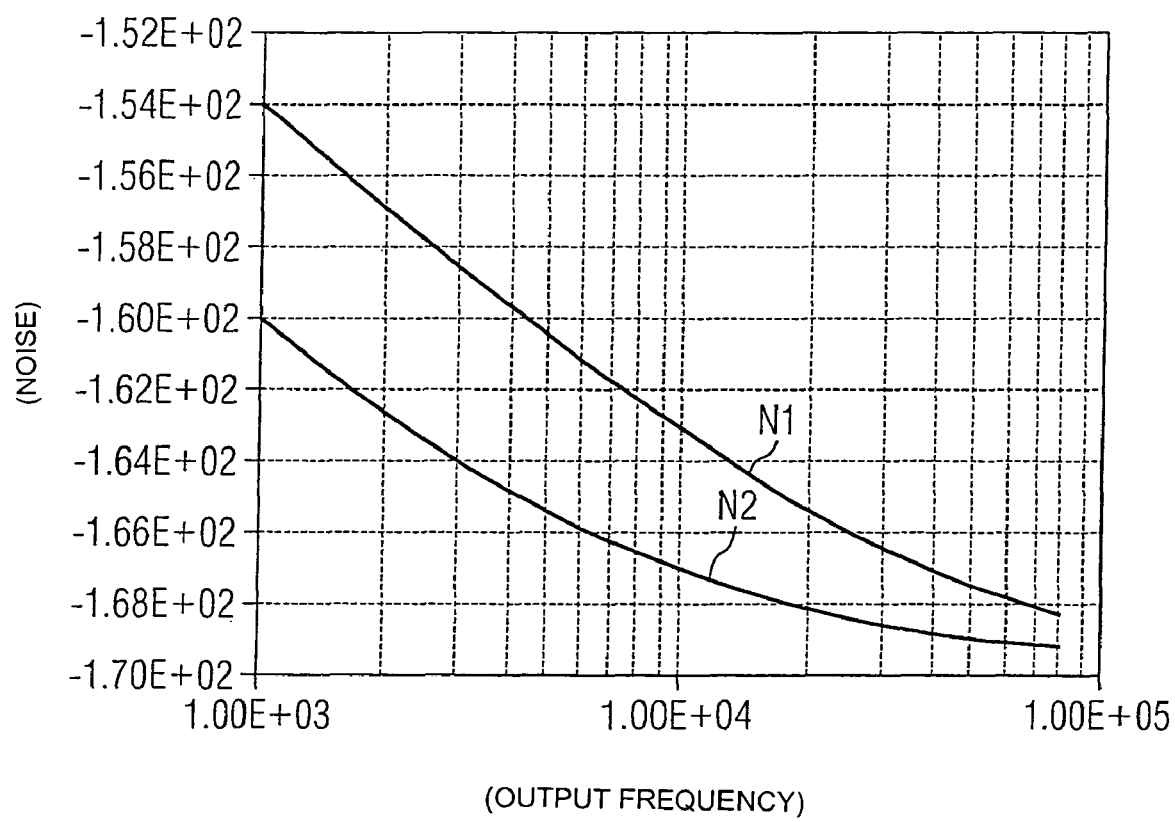
FIG. 6 is a graph illustrating noise curves as a function of the frequency of a known mixer and of a mixer in accordance with one embodiment of the invention.
Figure 7:
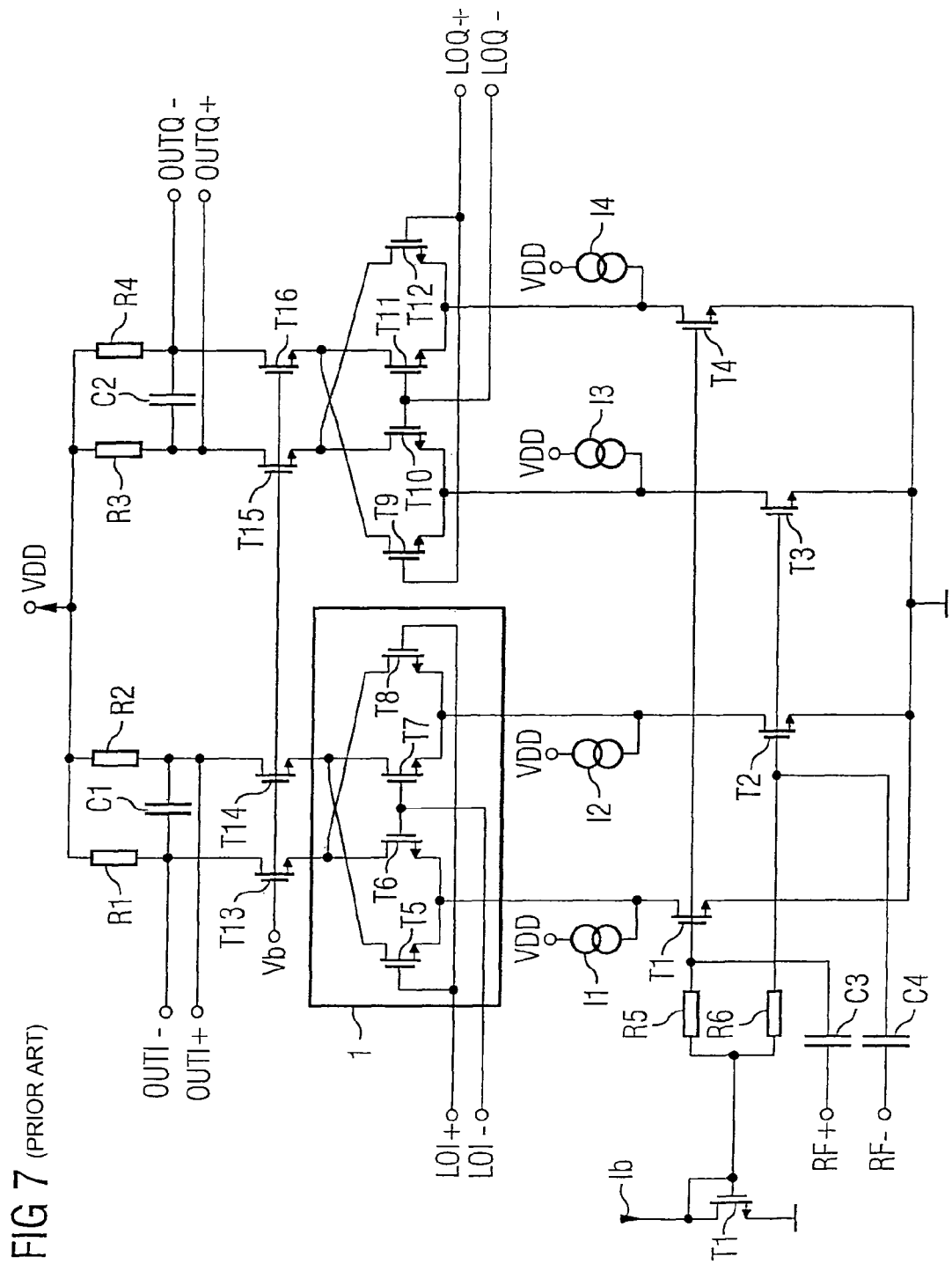
FIG. 7 shows a conventional I/Q mixer, embodied as a Gilbert mixer.

FIG. 6 shows a comparison of the noise properties of a known mixer in accordance with FIG. 7 and of a mixer arrangement according to an embodiment in FIG. 3. A comparable gain and also a comparable linearity are assumed in this case. In the diagram, the x-axis represents the output frequency of the converted signal and the y-axis represents the noise in $dBV/\sqrt{Hz}$. It can clearly be discerned in FIG. 6 that the noise curve N1 of a conventional known mixer is significantly greater than the noise curve N2 of a mixer according to the embodiment of FIG. 3 over the entire frequency range shown. The difference results from the reduced flicker noise on account of the greatly reduced DC current component flowing through the mixer cell.

Figure 4:
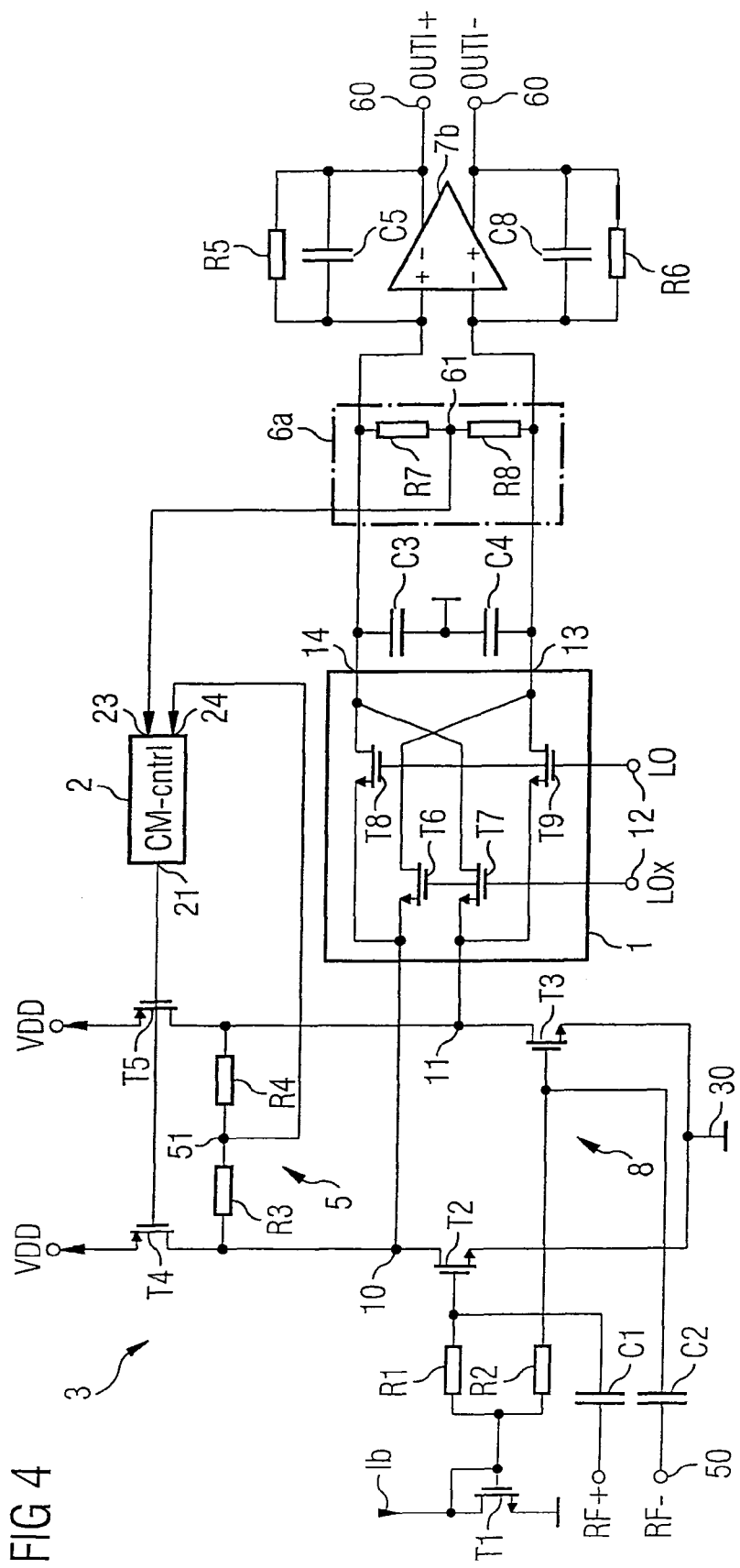
FIG. 4 is a schematic diagram illustrating another embodiment of the invention.

A further embodiment of the mixer arrangement is illustrated in FIG. 4. In this embodiment, the current-voltage conversion at the signal outputs 13 and 14 of the mixer cell 1 is performed by means of an operational amplifier 7b. For this purpose, the signal output 13 is connected to a first, inverting input "−" of the operational amplifier circuit 7b and the signal output 14 of the mixer cell 1 is connected to a second, noninverting input "+" of the operational amplifier circuit. On the output side, the operational amplifier circuit is connected to the mixer output 60. This embodiment affords the possibility of achieving very high gains. It is thereby possible, under certain circumstances, to obviate further amplifiers in the subsequent analog baseband.

In order to improve the impedance profile of the current-voltage converter with the operational amplifier 7b, a passive prefilter is additionally provided. For this purpose, the inverting output "−" of the operational amplifier 7b is fed back to the noninverting input "+" of the operational amplifier 7b via a capacitor C5 and a resistor R5 arranged in parallel therewith. The noninverting output "+" is correspondingly fed back to the inverting input "−" of the operational amplifier 7b via a capacitor C6 and a resistor R6 connected in parallel therewith. With the parallel circuit comprising resistors and capacitors an additional passive filtering is made possible and the input impedance profile of the current-voltage converter is improved.

Figure 5:
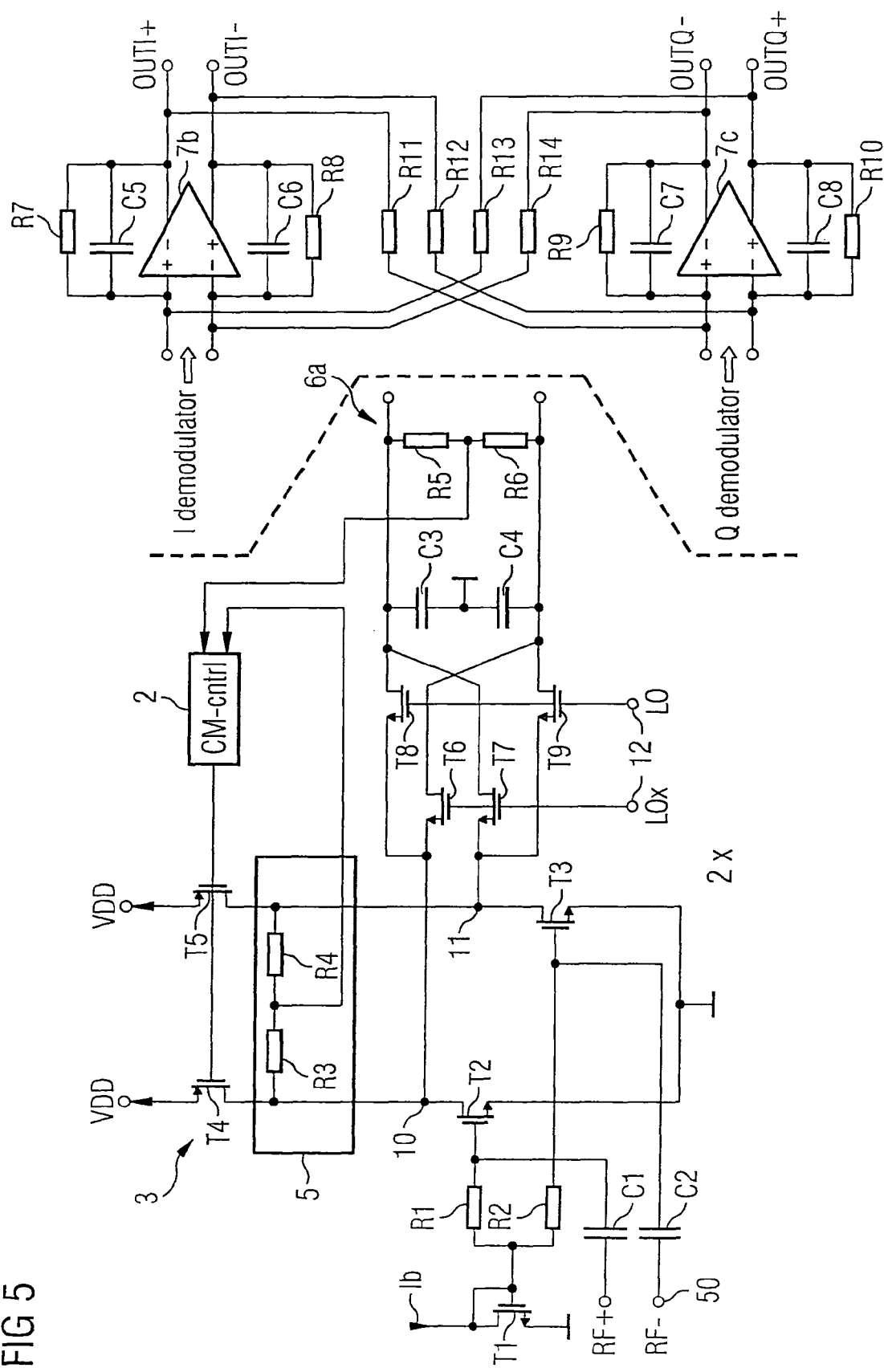
FIG. 5 is a schematic diagram illustrating another with a polyphase filter.

In addition, the current-voltage conversion by means of an operational amplifier circuit affords the advantage that the pole point on the output side can be realized as a complex pole point in a very simple manner. Such an embodiment is shown in FIG. 5.

Two mixer arrangements according to an embodiment of the invention are provided in this configuration. Each of the two mixer arrangements has an operational amplifier 7b, 7c, the inputs of which are connected to the outputs of the respective mixer cell of the mixer arrangement.

The arrangement illustrated serves for converting a radiofrequency signal into a real component I and a quadrature component Q at an intermediate frequency. The two mixer arrangements form a so-called I/Q frequency converter. For this purpose, a first local oscillator signal LO, LOx, is fed to the first mixer arrangement at the inputs 12 of the mixer cell 1. The second mixer arrangement is fed a second local oscillator signal, the phase of which is offset by 90° relative to the first local oscillator signal. By means of the signal processing with the two phase-offset local oscillator signals current signals at an intermediate frequency are generated at the outputs of the two mixer cells of the first and second mixer arrangements, the mixer cell of the first mixer arrangement outputting a real component I and the mixer cell of the second mixer arrangement outputting a quadrature component Q.

The signal outputs of the mixer cell of the first mixer arrangement are connected to the operational amplifier 7b and the signal outputs of the mixer cell of the second arrangement are connected to the operational amplifier 7c. These in turn serve for current-voltage conversion and output a voltage signal at their outputs. The resistors R11, R12, R13 and R14 are additionally provided. The resistor R11 couples the inverting output of the operational amplifier 7b to the input of the operational amplifier 7c. The resistor R12 couples the noninverting output of the operational amplifier 7b to the inverting input of the operational amplifier 7c of the second mixer arrangement. The resistor R13 correspondingly connects the input of the operational amplifier 7b to the output "+" of the operational amplifier 7c and the resistor R14 connects the inverting input of the operational amplifier 7b to the inverting output of the operational amplifier 7c. This arrangement realizes a complex polyphase filter which is expedient in particular in the case of frequency conversion to the intermediate frequency of 0 HZ.

In the embodiments shown here, which can be realized as integrated circuits in semiconductor bodies as well, suppression and reduction of the flicker noise within the mixer cell of a mixer arrangement are achieved by virtue of the fact that the respective common-mode potentials or common-mode signals at the signal inputs and signal outputs of the mixer cell are adapted to one another. The DC current or the DC voltage dropped across the mixer cell is thereby reduced. A sufficient linearity is nevertheless maintained within the mixer cell for the actual frequency conversion process. In this case, the regulation may be effected both by altering the common-mode current at the signal inputs of the mixer cell and by altering the common-mode level at the signal outputs of the mixer cell.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A mixer arrangement comprising:
a mixer input configured to receive a radiofrequency signal;
a mixer cell comprising a signal input coupled to the mixer input, a local oscillator signal input, and a signal output, wherein the mixer cell is configured to frequency convert a signal present at the signal input to an intermediate frequency;
a first current source coupled to the signal input of the mixer cell;
a second current source coupled to the signal output of the mixer cell;
wherein at least one current source of the first and second current source is configured as a regulatable current source comprising a control input; and
a first sensor circuit configured to detect and output a value derived from a current level of the at least one current source;
a second sensor circuit coupled to the signal output of the mixer cell and configured to detect a common-mode level present thereat;
a desired value regulating circuit comprising a feedback input coupled to the first sensor circuit, and a regulating output coupled to the control input of the at least one current source, wherein the desired value circuit is configured to output a regulating signal to the regulating output that is derived from a comparison of a signal present at the feedback input with a desired value based on the common-mode level detected at the signal output by the second sensor circuit, thereby regulating the at least one current source.

2. The mixer arrangement of claim 1, wherein the first sensor circuit is configured to detect a common-mode level of the at least one current source.

3. The mixer arrangement of claim 1, wherein the first sensor circuit comprises a first resistor and a second resistor connected in series, the respective other terminals of which are connected to the at least one current source, and between the resistors a tap is coupled to the feedback input of the desired value regulating circuit.

4. The mixer arrangement of claim 1, further comprising a means for providing the desired value connected to a reference input of the desired value regulating circuit.

5. The mixer arrangement of claim 4, wherein the providing means is configured to detect a value derived from a current level of the other current source of the first and second current source.

6. The mixer arrangement of claim 4, wherein the means comprises a first resistor and a second resistor connected in series, the respective other terminals of which are connected to the signal output of the mixer cell, and between the resistors a tap is coupled to the reference input of the desired value regulating circuit.

7. The mixer arrangement of claim 4, wherein the means comprises a first transistor and a second transistor connected in series, which are connected between a supply potential terminal and a ground potential terminal, and between the transistors a tap is coupled to the reference input of the desired value regulating circuit.

8. The mixer arrangement of claim 1, wherein the at least one current source comprises a transistor, a first terminal of which is coupled to a supply potential terminal a second terminal of which forms an output of the at least one current source, and a control terminal of which is coupled to the control input of the at least one current source.

9. The mixer arrangement of claim 1, wherein the desired value regulating circuit is configured to output a regulating signal, in such a way that a substantially identical common-mode level is present at the signal input and at the signal output of the mixer cell during operation of the mixer arrangement.

10. The mixer arrangement of claim 1, further comprising a current-voltage converter configured to convert a current signal output by the mixer cell into a voltage signal, wherein the converter is connected downstream of the signal output of the mixer cell.

11. The mixer arrangement of claim 1, further comprising an operational amplifier connected downstream of the signal output of the mixer cell.

12. The mixer arrangement of claim 11, wherein an output of the operational amplifier is coupled to an input of the operational amplifier via a capacitive element and a resistive load arranged in parallel therewith.

13. The mixer arrangement of claim 1, further comprising a voltage-current converter connected between the mixer input and the signal input of the mixer cell, and configured to convert a voltage signal to a current signal.

14. The mixer arrangement of claim 1, wherein the desired value comprises the common-mode level at the signal output of the mixer cell detected by the second sensor circuit, and wherein the common-mode level comprises an average of two potentials at the signal output of the mixer cell.

* * * * *